US008716745B2

(12) United States Patent
Veeramma

(10) Patent No.: US 8,716,745 B2
(45) Date of Patent: May 6, 2014

(54) STABLE DIODES FOR LOW AND HIGH FREQUENCY APPLICATIONS

(75) Inventor: Subhas Chandra Bose Jayappa Veeramma, Lampertheim (DE)

(73) Assignee: IXYS Corporation, Milpitas, CA (US)

( * ) Notice: Subject to any disclaimer, the term of this patent is extended or adjusted under 35 U.S.C. 154(b) by 1535 days.

(21) Appl. No.: 11/432,836

(22) Filed: May 11, 2006

(65) Prior Publication Data

US 2006/0255379 A1 Nov. 16, 2006

Related U.S. Application Data

(60) Provisional application No. 60/681,000, filed on May 12, 2005.

(51) Int. Cl.
*H01L 29/66* (2006.01)

(52) U.S. Cl.
USPC ........... 257/109; 257/106; 257/199; 257/212; 257/292; 257/E21.351; 257/E21.362; 257/E21.366; 257/E21.368; 257/E27.073; 257/E27.129; 257/E29.327; 257/E29.329

(58) Field of Classification Search
USPC .......................... 257/106, 109, 199, 212, 292, 257/E21.351–E21.362, E21.366, E21.368, 257/E27.073, E27.129, E29.327–E29.329
See application file for complete search history.

(56) References Cited

U.S. PATENT DOCUMENTS

| 4,606,781 | A |   | 8/1986  | Vyne            |         |
|-----------|---|---|---------|-----------------|---------|
| 4,972,247 | A |   | 11/1990 | Patterson et al.|         |
| 5,024,922 | A |   | 6/1991  | Moss et al.     |         |
| 5,101,244 | A |   | 3/1992  | Mori            |         |
| 5,138,415 | A |   | 8/1992  | Yano            |         |
| 5,241,210 | A |   | 8/1993  | Nakagawa et al. |         |
| 5,262,754 | A |   | 11/1993 | Collins         |         |
| 5,316,964 | A |   | 5/1994  | Gross           |         |
| 5,742,087 | A | * | 4/1998  | Lidow et al.    | 257/342 |
| 5,804,868 | A |   | 9/1998  | Kobayshi et al. |         |
| 5,986,289 | A | * | 11/1999 | Simmonet        | 257/109 |
| 5,994,189 | A |   | 11/1999 | Akiyama         |         |
| 2003/0141516 | A1 |   | 7/2003 | Auriel         |         |
| 2004/0119087 | A1 |   | 6/2004 | Bose et al.    |         |

FOREIGN PATENT DOCUMENTS

| EP | 0 364 760 A | 4/1990  |
| EP | 0 521 558 A | 1/1993  |
| EP | 1 098 355 A | 5/2001  |
| EP | 1 717 863 A | 11/2006 |

(Continued)

OTHER PUBLICATIONS

Office Action for Korean Intellectual Property Office patent application KR10-2006-0042625 (Aug. 30, 2012).

(Continued)

*Primary Examiner* — Meiya Li
(74) *Attorney, Agent, or Firm* — Imperium Patent Works

(57) ABSTRACT

A diode is defined on a die. The diode includes a substrate of P conductivity having an upper surface and a lower surface, the substrate having first and second ends corresponding to first and second edges of the die. An anode contacts the lower surface of the substrate. A layer of N conductivity is provided on the upper surface of the substrate, the layer having an upper surface and a lower surface. A doped region of N conductivity is formed at an upper portion of the layer. A cathode contacts the doped region. A passivation layer is provided on the upper surface of the layer and proximate to the cathode.

19 Claims, 5 Drawing Sheets

(56) References Cited

FOREIGN PATENT DOCUMENTS

| JP | 53083472 A | 7/1978 |
|----|------------|--------|
| WO | WO 00/38243 A | 6/2000 |
| WO | WO 02/31885 A | 4/2002 |

OTHER PUBLICATIONS

Ajit J S et al., "1200 V High-Side Lateral MOSFET in Junction-Isolated Power IC Technology Using Two Field-Reduction Layers," Power Semiconductor Devices and ICS 1993 ISPSD '93., Proceedings of the 5$^{th}$ International Symposium on Monterey, CA USA May 18-20, 1993., 230-235 (1993).
European Search Report of Oct. 14, 2009 for European Application EP 06 00 9504.
European Search Report of Apr. 20, 2005 for European Application EP 03 01 8788.
U.S. Appl. No. 10/650,451, Non Final Office Action mailed Sep. 13, 2010.
U.S. Appl. No. 10/650,451, Final Office Action mailed Mar. 3, 2010.
U.S. Appl. No. 10/650,451, Examiner Interview Summary mailed Sep. 26, 2008.
U.S. Appl. No. 10/650,451, Advisory Action mailed Jul. 25, 2008.
U.S. Appl. No. 10/650,451, Final Office Action mailed Mar. 6, 2008.
U.S. Appl. No. 10/650,451, Non Final Office Action mailed Jun. 14, 2007.
U.S. Appl. No. 10/650,451, Final Office Action mailed Jan. 31, 2006.
U.S. Appl. No. 10/650,451, Non Final Office Action mailed Jul. 18, 2005.
U.S. Appl. No. 10/650,451, Final Office Action mailed Jan. 4, 2005.
U.S. Appl. No. 10/650,45, Non Final Office Action mailed Jul. 14, 2004.
U.S. Appl. No. 10/650,451, Restriction Requirement mailed May 4, 2004.

* cited by examiner

STABLE DIODES FOR LOW AND HIGH FREQUENCY APPLICATIONS

CROSS-REFERENCE TO RELATED APPLICATION

The present invention claims the benefit of application Ser. No. 60/681,000, filed on May 12, 2005, which is incorporated by reference.

BACKGROUND OF THE INVENTION

The present invention relates to power devices, more particularly to the design and fabrication of diodes.

The diodes are commonly used in both low and high frequency applications. For low frequency applications, the "slow" diodes, such as, rectifier diode, are used. The slow diodes generally are formed without adding any local lifetime control elements. However, for high switching frequencies, e.g., for use with power switches such as Insulated Gate Bipolar Transistors (IGBT), the "fast" diodes are used. These fast diodes can be obtained by varying the doping profiles and local lifetime control. Local lifetime control is achieved either by exposing the diode to ion beams (helium) or by doping with heavy-transition metals (gold or platinum).

Planar diffusion technology is widely used for the fabrication of power devices. Planar diffusion process selectively introduces dopant into the semiconductor surface by using either an oxide layer as a mask against dopant diffusion or by using a photoresist layer to block the dopant during ion implantation.

FIG. 1 shows a conventional diode 100. The diode includes an N− silicon layer 101 with low doping concentration, an N+ silicon region 102 with high doping concentration, and a cathode 105 that is in contact with the N+ region 102. The N+ region 102 can be a substrate of an epi-wafer or a diffused layer. The front side of the diode includes a P+ doped emitter region 103 and an anode 106 that contacts the emitter region 103. A channel stopper 104 is formed at an edge 113 of the die and is typically an N+ region. In diodes that are designed for higher blocking voltage, e.g., 600 volts or more, the emitter region 103 is surrounded with one or more guard rings 107. A passivation layer 108, e.g., thermal oxide, is formed on the upper surface of the N− layer 101 and the emitter region 103. Generally, the thermal oxide is used when the passivation layer is formed directly on the silicon.

The emitter region 103 is formed by selectively diffusing the P-type dopants into the N− layer 101. As a result, the diffusion window has a substantially planar region or parallel plane 109 at the P-N junction between the emitter region 103 and the N− layer 101. Since the dopants also diffuse laterally, the diffusion window also has a curved edge 110 with a radius that is 80-90% of the vertical junction depth, depending on the dopant concentration of the emitter region.

During the reverse bias condition, the breakdown voltage of the planar P-N junction is limited due to the curvature effect associated with the curved edge 110. One method of increasing the breakdown voltage is to reduce the electric field at the main junction, e.g., at the curved edge 110, by using one or more guard rings 107. The term "floating field rings (FLR)" is also used to refer to the guard rings since these rings include diffused regions that are isolated from the main junction and provided at close proximity thereto. The main junction refers to the P-N junction defined by the emitter region (or P region) and the N− region. Typically, these guard rings or FLRs are formed using the same processing step used to form the emitter region 103, i.e., by creating extra implantation windows in the mask that surrounds the emitter region 103.

When a reverse bias voltage is applied to the cathode 105 of the diode, the depletion layer that is initially associated with the main junction extends outward with the increase in the reverse bias voltage. The first ring 107 is provided at a given space from the main junction so that punch-through takes place before the avalanche breakdown voltage occurs at the main junction, thereby limiting the maximum electric field across the main junction. A further increase in the reverse voltage is shared with the first ring until the depletion layer punches through to the adjacent second ring. Therefore, the FLR structure acts like a voltage divider minimizing the electric field at the edges of the main junction, and the breakdown voltage increases to the 90 percent of plane parallel or ideal breakdown voltage.

For the field ring structure to be effective, the spacing between the rings should be individually optimized to prevent the avalanche breakdown. If the rings are not provided with proper spacing, the rings can suffer from surface instabilities caused by high electric fields and charges generated during the formation of the passivation layer 108. The surface or passivation charges can cause a variation in the surface potential and create surface channels on the lightly-doped region between the rings, which would result in leakage current. This alters the potential sharing between the rings, and the device breakdown may occur when there is excess charge due to increase in the electric field.

FIG. 2 illustrates a diode 200 having a plurality of metal field plates 211. The metal field plates are used to reduce the charges ("passivation charges") associated with the formation of the passivation layer. The diode 200 includes an N− silicon layer 201 with low doping concentration, an N+ silicon region 202 with high doping concentration, and a cathode metal 105 that contacts the N+ region 202. The N+ region 202 is typically a substrate of an epi-wafer or a diffused layer. The front side of the diode includes a P+ doped emitter region 203 and an anode 206 that is in contact with the emitter region 203. The emitter region defines a diffusion window that has a substantially planar region (or parallel plane) 209 and a curved edge 210.

A channel stopper 204 is formed at the edge 213 of the die and is typically an N+ region. A plurality of guard rings 207 surrounds the emitter region (or main junction). A first passivation layer 208 is formed on the upper surface of the N− layer 201 and the emitter region 203. A second passivation layer 212 is formed on the first passivation layer and the metal field plates to prevent arcing between the metal plates. The second passivation layer may be made of polyimide or silicon nitride.

Even with the guard rings and the metal plates, it is difficult to obtain a 100%-planar-region breakdown voltage due to the curvature effects of the curved edge 210. In addition, for fast diodes or FREDs that are doped with platinum or gold, the channel stopper needs to be designed, so that the depletion width does not go underneath the channel stopper and touch the die edge 213 since that would result in channeling current.

FIG. 3 illustrates the curvature effects of the curved edge 210 of the diode 200. The current and voltages concentrate at the curved edge 210 more so than the planar region 209. Such a phenomenon presents an even more challenge in diode development with the introduction of the switching transients with very high di/dt and dv/dt conditions since the static current density at the curvature junction may crack or burn out the silicon depending upon the crystal orientation.

FIG. 4 illustrates a diode 400 configured to reduce the current density at the curvature. A small resistor 414 (or resistance value) is provided in the emitter region. If this series resistance is sufficiently small, e.g., 3 ohm, the diode does not burn since the voltage drop across the series resistor helps in reducing in the current density at the curvature junction. However, designing such a small series resistance into the emitter region tends to be a difficult task.

SUMMARY OF THE INVENTION

The present invention as shown in FIG. 5 relates to power devices. Embodiments of the present invention are directed to diodes having one or more of the following characteristics: (1) provide 100%-planar-region breakdown voltage, (2) not burn out at specified switching conditions due to the curvature effect, (3) be less sensitive to passivation charge effect, (4) eliminate the channeling current, and (5) require the use of a thinner N− layer.

A diode according to one embodiment includes one or more of the following characteristics as shown in FIG. 5: (1) the anode is longer than the cathode, (2) the anode contacts a P substrate that does not have a curved edge, (3) the P layer contacting the anode is longer than the doped region contacting the cathode, (4) a vertical isolation region at the edge of the die extends from the upper surface N− layer to the lower surface of the N− layer, (5) the anode and cathode are provided proximate to the backside and front side of the diode, respectively, and (6) the cathode and the passivation layer are provided on the same side of the diode.

In one embodiment, a diode includes a first layer of a first conductivity type having an upper surface and a lower surface; a second layer of a second conductivity type being provided over the upper surface of the first layer, the second layer having an upper surface and a lower surface, the lower surface of the second layer facing the upper surface of the first layer; an anode being provided proximate to the lower surface of the first layer; a cathode being provided proximate to the upper surface of the second layer; and a passivation layer being provided proximate to the upper surface of the second layer. The first layer has N conductivity and the second layer has P conductivity.

In one embodiment, the diode further comprises a doped region of a second conductivity type being formed in an upper portion of the second layer and contacting the cathode. An isolation region is formed at an edge of the substrate. The isolation region extends vertically from the upper surface of the second layer to the lower surface of the second layer. The first layer contacts the anode, and the upper surface of the first layer is substantially planar. The substantially planar upper surface of the first layer is configured to provide a substantially uniform potential contour at a breakdown voltage of the diode.

In one embodiment, the diode is configured to cause the maximum electric field during a breakdown voltage to occur at an interface between the first layer 515 (substrate) and the second layer 501 (N− layer). The diode is configured to cause the maximum electric field during a breakdown voltage to occur at a location that is separated from the passivation layer by at least a thickness of the second layer, thereby making the diode less sensitive to a passivation charge effect. The anode is longer in width than the cathode. The isolation region has a dopant concentration of 1E18 to 5E19 per cm$^3$ at an upper surface of the isolation region. The substrate has resistivity between 0.01 to 0.05 ohm-cm.

In one embodiment, the diode further includes a first metal field plate extending outwardly from the doped region by 10 to 50 micrometers and a second metal field plate extending outwardly from the isolation region by 20 to 100 micrometers, wherein the first and second metal field plates defining a gap of 40 to 100 micrometers.

In one embodiment, the diode further includes a first metal field plate extending outwardly from the doped region; and a second metal field plate extending outwardly from the isolation region, the second metal field plate having an extension that is provided over the isolation region and within a boundary defined by an inner edge of the isolation region.

In another embodiment, a diode is defined on a die. The diode includes a substrate of P conductivity having an upper surface and a lower surface, the substrate having first and second ends corresponding to first and second edges of the die; an anode contacting the lower surface of the substrate; a layer of N conductivity being provided on the upper surface of the substrate, the layer having an upper surface and a lower surface; a doped region of N conductivity being formed at an upper portion of the layer; a cathode contacting the doped region; and a passivation layer being provided on the upper surface of the layer and being proximate to the cathode.

In yet another embodiment, a method for forming a diode includes providing a substrate of P conductivity having an upper surface and a lower surface; forming an anode directly on the lower surface of the substrate; forming a doped region of N conductivity at an upper portion of a layer of N conductivity, the layer being provided directly on the substrate; forming a cathode directly on the doped region; and forming a passivation layer directly on an upper surface of the layer.

DETAILED DESCRIPTION OF THE INVENTION

The present invention relates to power devices, e.g., diodes. Embodiments of the present invention provide the diode that exhibit robust characteristics for both high and low frequency applications. In one embodiment, the diode has an anode that is provided proximate to a lower surface of the diode and a cathode that is provided proximate to an upper surface of the diode, unlike the convention diode that has the anode provided proximate to the upper side and the cathode provided proximate to the lower side. In another embodiment, the diode has an anode that contacts a P region and a cathode that contacts an N region, where the P region is greater in width than the N region which is contrary to the conventional diode. Accordingly, the present diode is also referred to a "reverse diode" for one or more reasons above.

Figure 5:
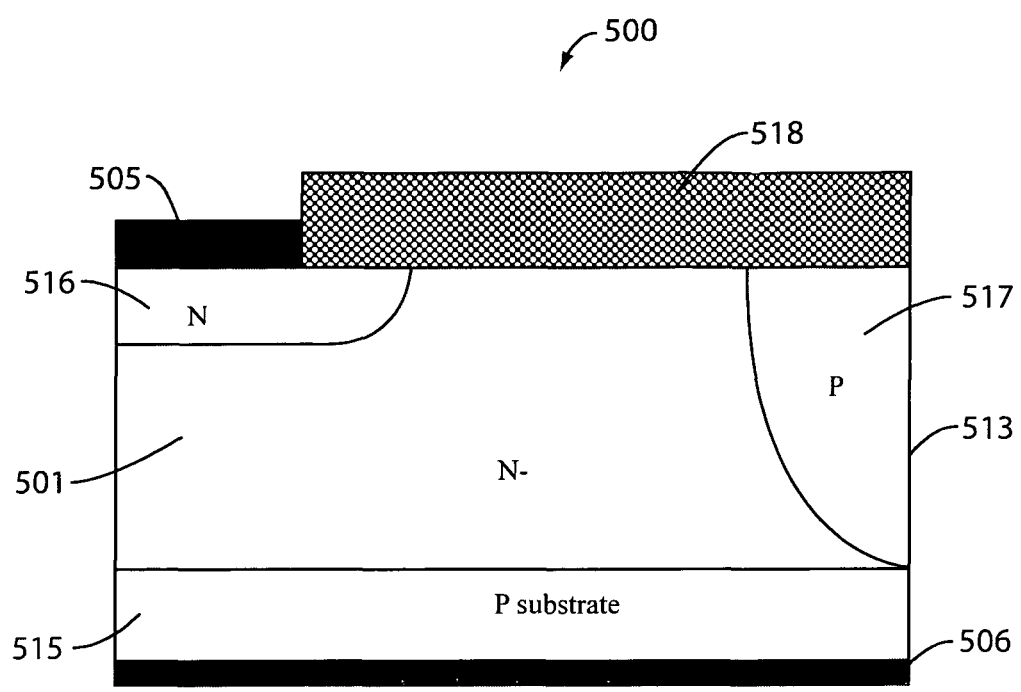
FIG. 5 illustrates a diode according to one embodiment of the present invention.

FIG. 5 illustrates a diode 500 according to one embodiment of the present invention. The diode 500 includes an N− type silicon layer 501 with low doping concentration. In one implementation, the N− layer 501 is an epi-layer that is grown on another layer or substrate. A P-type layer or substrate 515 is provided below the N− layer 501. The P substrate 515 may be a substrate of an epi-wafer or a diffused layer. The P substrate 515 extends substantially from one end of the die to the other end. The P substrate 515 does not have a curved edge, unlike in the diode 300, whereon a high static current density may be formed. Accordingly, the ends of the substrate correspond to the edges of the die in the present embodiment.

The P-type substrate 515 may be doped with high or low doping concentration according to application. For example, the substrate 501 or 915 has resistivity of no more than 0.08 ohm-cm, or no more than 0.06 ohm-cm, or no more than 0.05 ohm-cm according to applications. In one implementation, the substrate 501 or 915 has resistivity between 0.01 to 0.05 ohm-cm.

An anode 506 is provided proximate to the lower side (or backside) of the diode and contacts the P-type substrate 515. The anode extends substantially the entire backside according to the present implementation. In other implementations, the anode may extend only a portion of the backside. A cathode 505 is provided proximate to the upper side (or front side) of the diode. An N or N+ doped region 516 is formed at the upper portion of the N− layer 501. The upper surface of the N region 516 corresponds to the upper surface of the N− layer 501. The cathode contacts the upper surface of the N region 516. The N region (or doped region) 516 extends vertically and laterally into the N− layer 501. The lower surface of the doped region and the lower surface of the N− layer 501 are separated by a distance D1. A P-type isolation region 517 is formed at the edge 513 of the die and is separated from the doped region 516 by a distance D2. In the present embodiment, the distance D2 is greater than or equal to the distance D1.

The P-type isolation region 517 extends from the upper surface of the N− layer 501 to the upper surface of the P substrate 515 to support the blocking voltage. In addition, since the isolation region 517 extends downward to the P substrate 515, life time killers, e.g., platinum or gold, may be added without worrying about having the depletion width touching the die edge 513 during breakdown voltage measurement and cause channeling current. The isolation region is formed by diffusing dopants (e.g., aluminum or boron, or both) into the N− layer from the upper surface in the present embodiment. In one embodiment, the isolation region provided with a surface dopant concentration of 1E18 to 5E19 per $cm^3$.

The present inventor has discovered that the P-type concentration in the substrate 515 should not be too high during the formation of the isolation region 517 by diffusion according to one embodiment of the present invention. A significant number of the P-type dopants (e.g., boron) in the substrate diffuse into the N− layer 501 during such a diffusion process if the substrate 515 has a high concentration of P-type dopants. This results in an unintended thinning of the N− layer, which lowers the breakdown voltage of the diode. Accordingly, the dopant concentration of the substrate should be suitably low to limit the "encroachment" of the substrate 515 into the N− layer during the formation of the isolation region 517.

In the present implementation, the surface concentration of the isolation region 517 is provided to be as high as possible to effectively support the blocking voltage. Boron is used as the dopant for the substrate and the isolation region. The substrate is provided with resistivity of 0.01 to 0.05 ohm-cm (8.4E18 to 8E17 per $cm^3$), and the boron surface concentration of the isolation region is provided to be greater than 1E19 per $cm^3$. With this lower dopant concentration, the substrate encroachment into the N− layer is minimized during the deep boron diffusion process for the isolation region 517. The parameters above, as with other parameters provided herein, are specific to a particular application described. Accordingly, different parameters (e.g., dopant concentration) may be used for different applications.

A passivation layer 518 is formed on the upper surface of the N− layer 501 and the isolation region 517. The passivation layer may also be formed partly on the N region 516, so that the cathode contacts the passivation layer. The passivation layer may be glass, thermal oxide, polyimide, PECVD oxide, or silicon nitride according to application.

In one embodiment, the passivation layer 518 is PECVD oxide, i.e., oxide formed using a PECVD process, to make the diode less sensitive to the passivation charge effect, and thus reduce leakage current associated with the passivation charge effect. The PEVCD oxide grown in a plasma environment is believed to provide more positive charges than that grown thermally. These positive charges appear to provide a counter balance to the passivation charge effect, as explained in U.S. patent application Ser. No. 11/380,466 filed on Apr. 27, 2006, which is incorporated by reference.

As illustrated above, according to the present embodiment, the diode 500 includes one or more of the following characteristics: (1) the anode is longer than the cathode, (2) the anode contacts a P substrate that does not have a curved edge, (3) the P layer contacting the anode is longer than the doped region contacting the cathode, (4) a vertical isolation region at the edge of the die extends from the upper surface of the N− layer to the lower surface of the N− layer, (5) the anode and cathode are provided proximate to the backside and front side of the diode, respectively, and (6) the cathode and the passivation layer are provided on the same side of the diode.

FIGS. 6A-8B illustrate the simulation results that compare the electric field distribution and potential contours of the conventional diode 200 and the diode 500 of the above embodiment. These two diodes are configured to have comparable features; e.g., the N− layers of these diodes were provided with substantially the same thickness and resistivity. Table 1 show the parameters used for the diode 500 having the P substrate 515, N− layer 501, N region 516, P-type isolation diffusion 517. Table 2 shows the parameters used for the conventional diode 100 including the N+ substrate 102, N− layer 101, P emitter region 103 for emitter, P region 107 for guard rings, and N+ region 104 for channel stopper. The emitter region and guard rings have substantially the same surface concentration and depth for the diode 100 since they are formed at the same time using the same process.

TABLE 1

SIMULATION PARAMETERS USED FOR DIODE 500

| | |
|---|---|
| P (Boron) substrate resistivity | 0.02 Ohm-cm (3.2E18 cm−3) |
| N− (Phosphorous) layer resistivity | 21 Ohm-cm (2.09E14 cm−3) |
| N− (Phosphorous) layer thickness | 60 μm |

TABLE 1-continued

SIMULATION PARAMETERS USED FOR DIODE 500

| | |
|---|---|
| N (Phosphorous) region surface concentration | 1E19 cm-3 |
| N (Phosphorous) junction depth | 10 micrometers |
| P (Boron or Aluminum) isolation diffusion surface concentration | 1E19 cm-3 |

TABLE 2

SIMULATION PARAMETERS USED FOR DIODE 100

| | |
|---|---|
| N+ (Phosphorous) substrate resistivity | 0.003 Ohm-cm (2.2E19 cm-3) |
| N- (Phosphorous) layer resistivity | 21 Ohm-cm (2.09E14 cm-3) |
| N- (Phosphorous) layer thickness | 60 μm |
| P (Boron) emitter region (guard ring) surface concentration | 5E18 cm-3 |
| P (Boron) emitter (guard ring) junction depth | 10 micrometers |
| N+ (Channel stopper) surface concentration | 1E19 cm-3 |

Figure 6A:
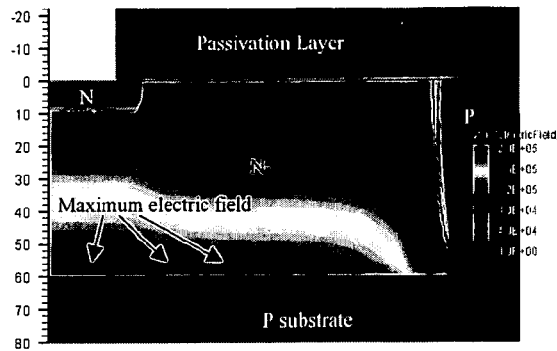
FIGS. 6A and 6B show simulation results on the electric field distribution and potential contour, respectively, of the diode of FIG. 5 at its breakdown voltage.
Figure 6B:
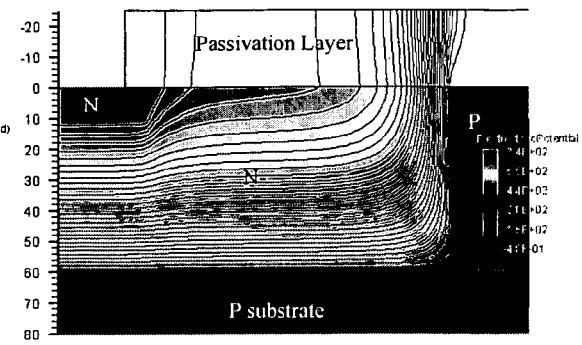

FIGS. 6A and 6B show simulation results on the electric field distribution and potential contour, respectively, of the diode 500 (or "reverse diode) at its breakdown voltage. FIG. 6A shows that the diode 500 has the breakdown voltage of 740V, and the maximum electric field occurs at the bulk between P substrate 515 and N- layer 501 at this voltage. FIG. 6B shows the potential contours at the breakdown voltage. The potential contours are substantially planar.

Figure 7A:
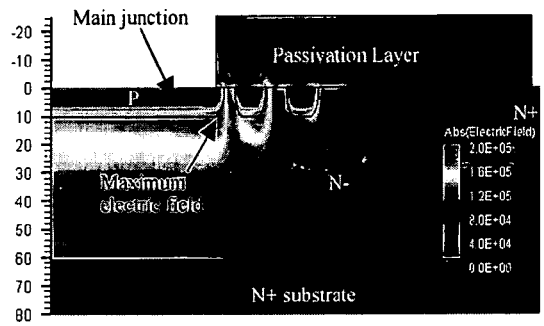
FIGS. 7A and 7B show simulation results on the electric field distribution and potential contour, respectively, the diode of FIG. 1 with the guard rings at the breakdown voltage.
Figure 7B:
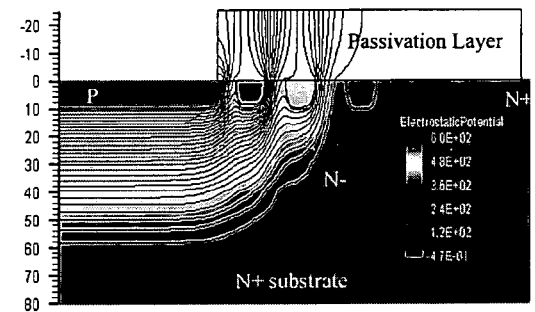

FIGS. 7A and 7B show simulation results on the electric field distribution and potential contour, respectively, the diode 100 with the guard rings 107 at the breakdown voltage. FIG. 7A shows that the diode has the breakdown voltage of 600V, and the maximum electric field occurs at the main junction, i.e., at the curved edge 110 due to the curvature effect. As shown in FIG. 7B, the potential contour resembles the curvature of the curved edge 110. The simulation results above show that the diode 500 having substantially the same N- layer thickness (i.e., 60 μm) has a significantly higher breakdown voltage than that of the diode 100, i.e., 740V versus 600V.

Figure 8A:
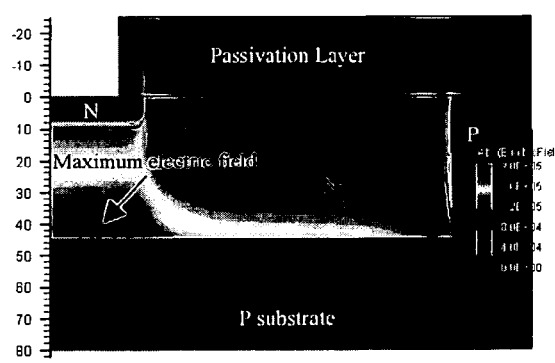
FIGS. 8A and 8B illustrates simulation results on the electric field distribution and potential contour, respectively, of a diode corresponding to the diode of FIG. 5.
Figure 8B:
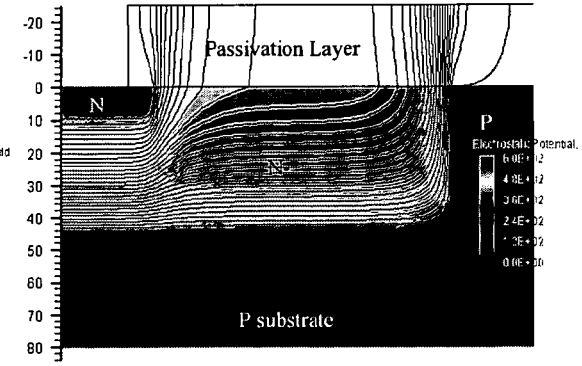

FIGS. 8A and 8B illustrates simulation results on the electric field distribution and potential contour, respectively, of a reverse diode corresponding to the diode 500. The reverse diode was provided with the N- layer having a reduced thickness, i.e., 45 μm which is 15 μm thinner than the diode 100 or 500. The reverse diode had the breakdown of 600V, which was the same as that of the diode 100 with N- layer thickness of 60 μm. The test results illustrate that, in general, if the N- layer resistivity the conventional diode 100 and the reverse diode 500 is the same, then the conventional diode 100 requires a greater N- thickness than the reverse diode 500 to obtain the same breakdown voltage.

Generally, the forward voltage drop of a diode depends upon the thickness of the N- layer, the resistivity of the N- layer, the doping concentration of the substrate, and N+ or P+ concentration. Based on the above experiments, the diode 500 can be provided with a lower forward voltage drop than the conventional diode 100 since the diode 500 provides the same breakdown voltage using a thinner N- layer when compared with the conventional diode 100.

Figure 1:
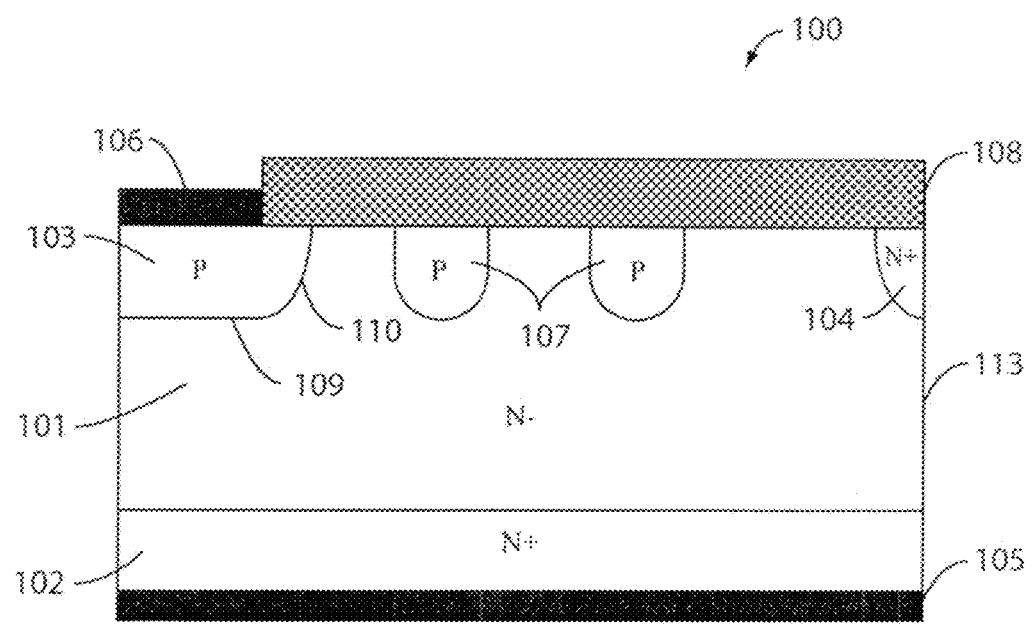
FIG. 1 shows a conventional diode.
Figure 2:
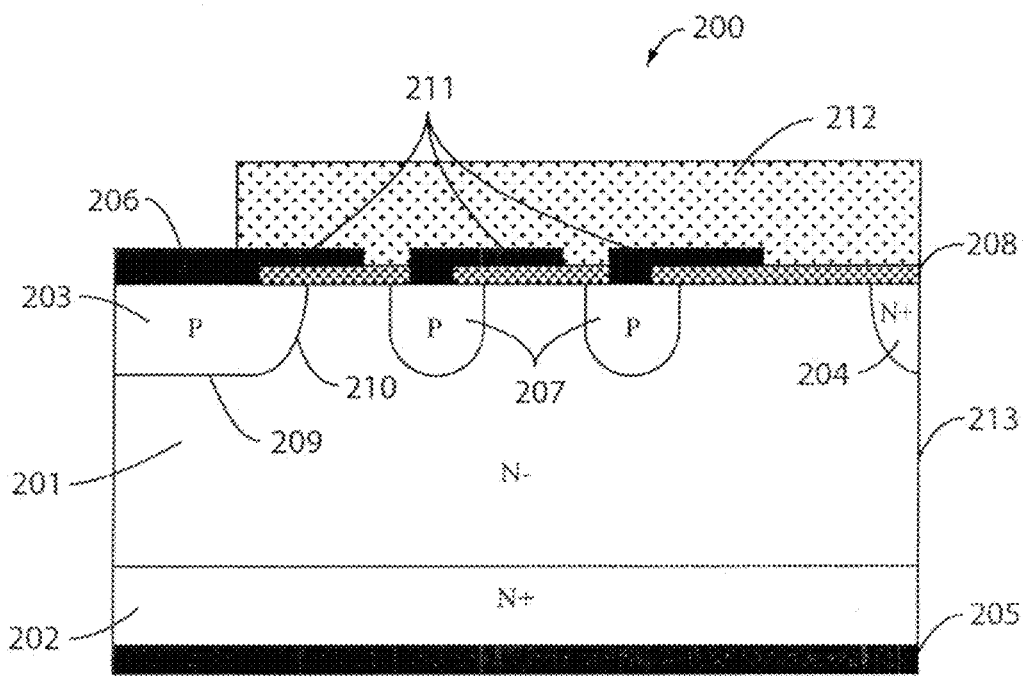
FIG. 2 illustrates a conventional diode having a plurality of metal field plates.
Figure 3:
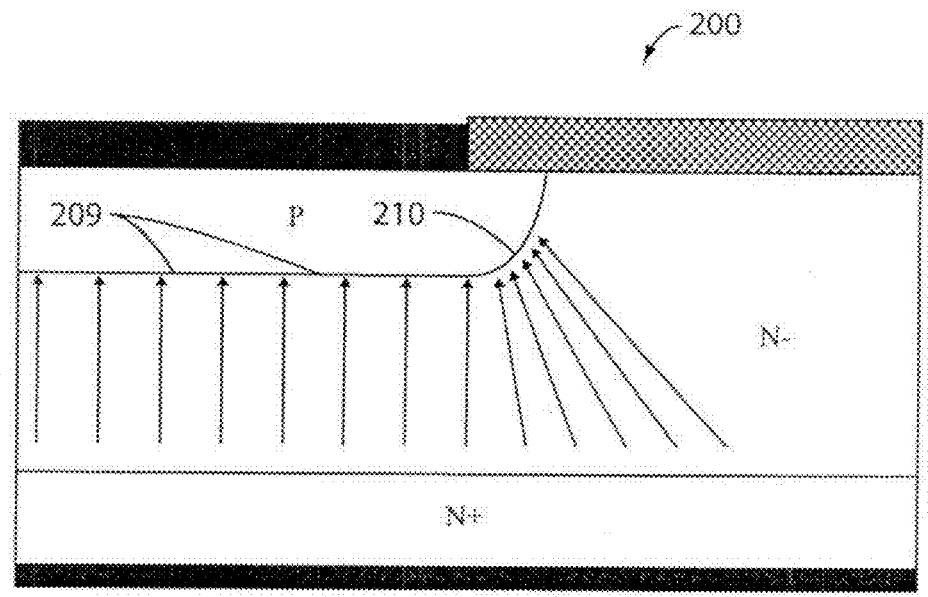
FIG. 3 illustrates a conventional diode and the curvature effect of the curved edge of the emitter region.
Figure 4:
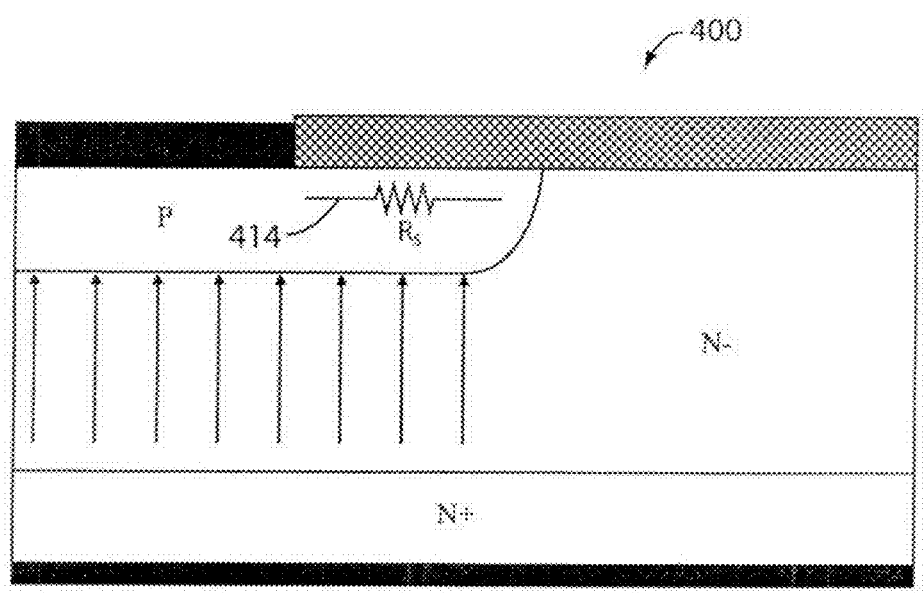
FIG. 4 illustrates a diode configured to reduce the current density at the curvature.

Referring back to FIGS. 6A and 6B, the diode 500 is less likely to burn out than the diode 100 during high di/dt switching conditions. The diode 500 does not have a curved edge that generates an increased static current density during the high switching conditions. The diode 500 is provided with the P substrate 515 that extends substantially from one end of the die to the other end. This eliminates the curvature effect associated with the curved edge 110 of the conventional diode 100. As a result, the diode 500 does not experience increase in static current density during high di/dt switching conditions as does the conventional diode 100 (see, e.g., FIG. 1 and FIG. 3).

In addition, the diode 500 is less sensitive to the passivation charge effect (or surface charge effect) because the maximum electric field occurs away from the passivation layer, i.e., at the interface between the P substrate 515 and N- layer 501. The diode may be made even less sensitive to the passivation charge effect by providing one or more metal field plates.

Figure 9:
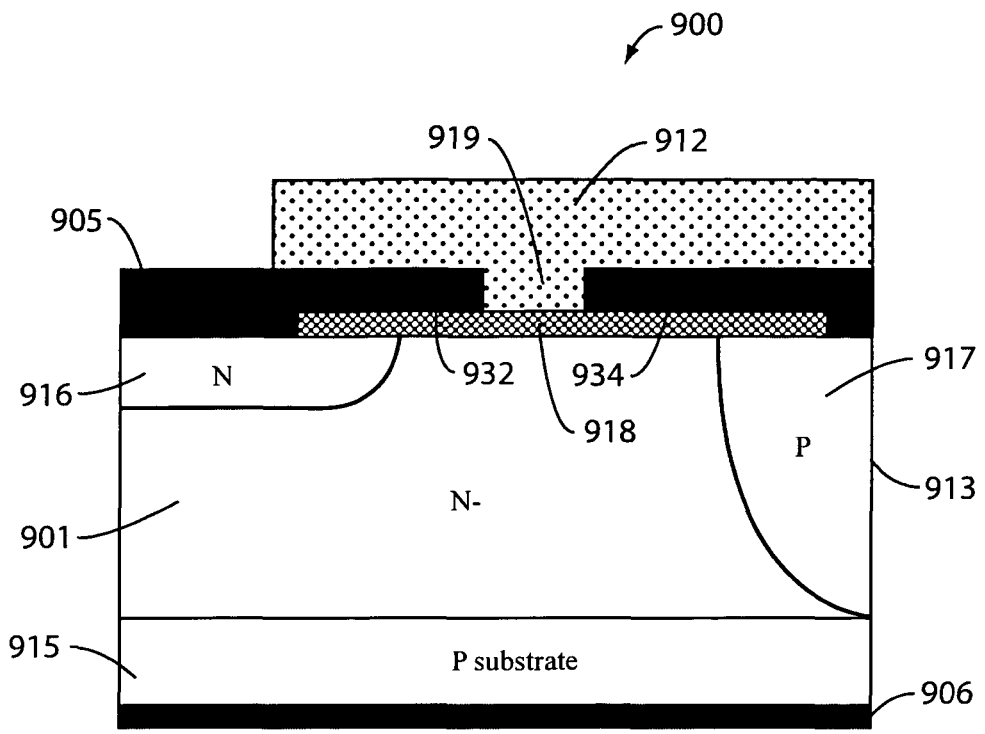
FIG. 9 illustrates a diode having one or more metal field plates according to one embodiment of the present invention.

FIG. 9 illustrates a diode 900 having one or more metal field plates 932 and 934 according to one embodiment of the present invention. The diode 900 is designed for a breakdown voltage up to 800V. The diode includes an N- type silicon layer 901 with low doping concentration. A P-type layer or substrate 915 is provided below the N- layer 901. In one implementation, the N- layer 901 is an epi-layer grown on top of the substrate 915.

The P substrate 915 extends substantially from one end of the die to the other end. The P substrate 915 does not have a curved edge, whereon high static current density may be formed. The P-type substrate 915 may be doped with high or low doping concentration according to application. For example, the substrate 915 has resistivity of no more than 0.08 ohm-cm, or no more than 0.06 ohm-cm, or no more than 0.05 ohm-cm according to applications. In one implementation, the substrate 915 has resistivity between 0.01 to 0.05 ohm-cm.

An anode 906 is provided proximate to the lower side (or backside) of the diode and contacts the P-type substrate 915. The anode extends substantially the entire backside according to the present implementation. In other implementations, the anode may extend only a portion of the backside. A cathode 905 is provided proximate to the upper side (or front side) of the diode. An N or N+ doped region 916 is formed at the upper portion of the N- layer 901. The cathode contacts the upper surface of the N region 916. The N doped region 916 extends vertically and laterally into the N- layer 901. A P-type isolation region 917 is formed at the edge 913 of the die.

The P-type isolation region 917 extends from the upper surface of the N- layer 901 to the upper surface of the P substrate 915 to support the blocking voltage. The isolation region is formed by diffusing dopants (e.g., aluminum or boron, or both) into the N- layer from the upper surface in the present embodiment. A first passivation layer 918 is formed on the upper surface of the N- layer 901 and the isolation region 917. The first passivation layer 918 may be thermal oxide, PECVD oxide, polyimide, or glass.

The first and second metal field plates 932 and 934 are formed on the first passivation layer 918. The first metal field plate 932 extends laterally toward the isolation region 917 from the N region 916 by 20 to 50 micrometers depending upon voltage class. The second metal field plate extends laterally toward the N region 916 from the isolation region 917 by 20 to 100 micrometers depending upon voltage class. The first and second metal field plates together define a gap or opening 919 of 40 to 100 micrometers. A second passivation layer 912 is formed on the first passivation layer and the metal field plates 932 and 934. The second passivation layer may be polyimide or silicon nitride.

Figure 10:
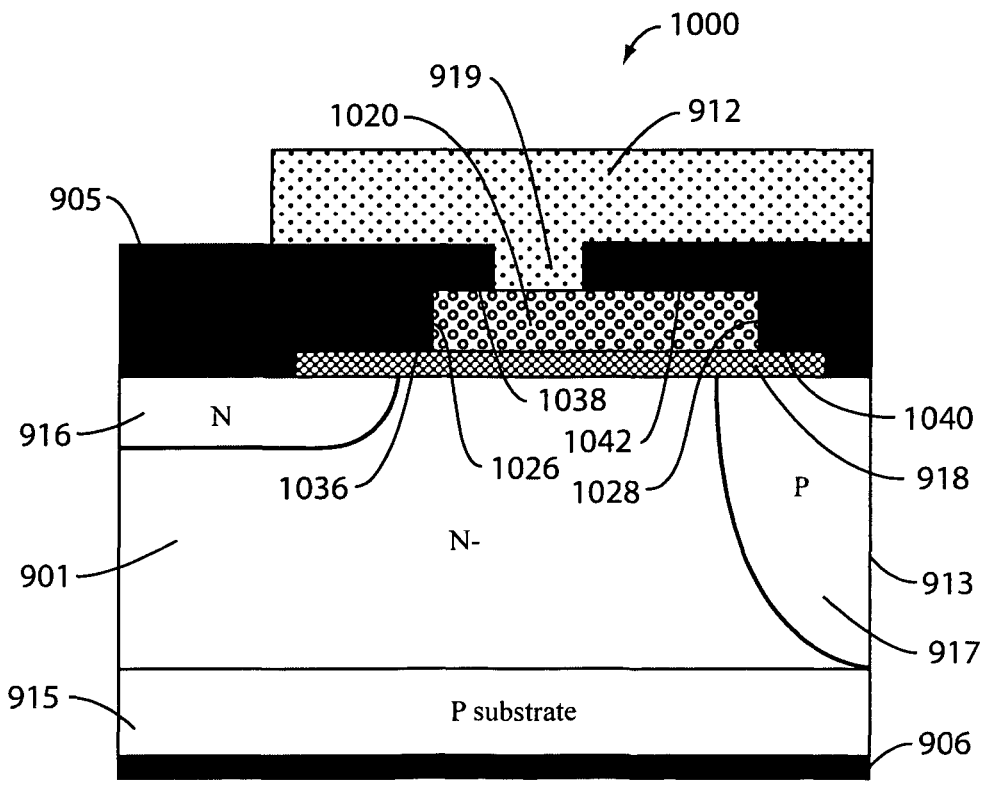
FIG. 10 illustrates a diode designed for a breakdown voltage greater than 800V according to one embodiment of the present invention.

FIG. 10 illustrates a diode 1000 designed for a breakdown voltage greater than 800V, e.g., up to 2000V, according to one embodiment of the present invention. The diode 1000 is similar to the diode 900 in design, and the same numerals are used to refer to like elements in FIGS. 9 and 10 where possible. The diode 1000 includes an intermediate passivation layer 1020 formed between the first passivation layer 918 and the second passivation layer 912.

In the present embodiment, the intermediate passivation layer 1020 is formed only on a portion of the first passivation layer, so that the sidewalls of the intermediate passivation layer define first and second steps 1026 and 1028 on the first passivation layer 918. The passivation layer 1020 is polyimide of 2 to 8 micrometers, or PECVD oxide of 1.2 to 3 micrometers, or silicon nitride of 0.5 to 3 micrometers. Generally, the passivation layer 1020 comprises polyimide if its thickness is to be 2 um or greater since it is easier to form polyimide of such a thickness than oxide.

A first metal field plate 1036 is formed on the first passivation layer 918 and the intermediate passivation layer 1020. The first metal field plate covers the first step 1026 and extends laterally from the N region 916 toward the isolation region 917. The upper surface of the intermediate passivation layer is partly covered by the first metal field plate. Accordingly, the first field plate has two lateral extensions 1036 and 1038 that resemble an up-side down steps.

Similarly, a second metal field plate 1036 extends laterally from the isolation region 917 to the N region 916. The second metal field plate covers the second step 1028 and extends laterally from the isolation region 917 toward the N region 916. The upper surface of the intermediate passivation layer is partly covered by the second metal field plate. Accordingly, the second field plate has two lateral extensions 1040 and 1042 that resemble an up-side down steps. The entire lateral extension 1040 is provided over the isolation region 917 and within a boundary defined by an inner edge of the isolation region 917. That is, the inner edge of the isolation region 917 extends further toward the N– region 901 than the inner edge of the lateral extension 1040 that abuts the second step 1028. The lateral extension 1040 is provided within the boundary of the isolation region 917 in the present embodiment. Premature breakdown may occur at the end of the extension 1040 towards the N– region if the extension 1040 extends more than isolation region 917 and breakdown voltage may decrease.

The present invention has been described in terms of specific embodiments to illustrate the present invention to those skilled in the art. The embodiments disclosed above may be changed or modified without departing from the scope of the present invention. Accordingly, the scope of the invention should be interpreted using the appended claims.

What is claimed is:

1. A diode, comprising:
   a first layer of a first conductivity type having an upper surface, a lower surface, a first edge, and a second edge opposite to the first edge;
   a second layer of a second conductivity type being provided over the upper surface of the first layer, the second layer having an upper surface and a lower surface, the lower surface of the second layer facing the upper surface of the first layer;
   an anode being provided proximate to the lower surface of the first layer;
   a cathode being provided proximate to the upper surface of the second layer and extending from the first edge of the first layer towards the second edge of the first layer;
   a passivation layer being provided proximate to the upper surface of the second layer
   a doped region of the second conductivity type formed in the second layer extending from the first edge of the first layer towards the second edge of the first layer; and
   an isolation region of the first conductivity type formed in the second layer extending from the upper surface of the second layer to the upper surface of the first layer.

2. The diode of claim 1, wherein the first layer is a substrate of P conductivity.

3. The diode of claim 2, wherein the first layer contacts the anode, the upper surface of the first layer being substantially planar.

4. The diode of claim 3, wherein the substantially planar upper surface of the first layer is configured to provide a substantially uniform potential contour at a breakdown voltage of the diode.

5. The diode of claim 2, wherein the second layer is an epi-layer formed on the subtrate, wherein the diode is configured to cause the maximum electric field during a breakdown voltage to occur at an interface between the substrate and the epi-layer.

6. The diode of claim 2, wherein the diode is configured to cause the maximum electric field during a breaksown voltage to occur at a location that is separated from the passivation layer by at least a thickness of the second layer, thereby making the diode less sensitive to a passivation charge effect.

7. The diode of claim 1, wherein the anode is longer in width than the cathode.

8. The diode of claim 2, wherein the isolation region has a dopant concentration of 1E18 to 5E19 per $cm^3$ at an upper surface of the isolation region.

9. The diode of claim 8, wherein the passivation layer comprises PECVD oxide.

10. The diode of claim 1, wherein the substrate has resistivity between 0.01 to 0.05 ohm-cm.

11. The diode of claim 2, further comprising:
    a first metal field plate being provided on the upper surface of the second layer and extending outwardly from the doped region by 20 to 50 micrometers; and
    a second metal field plate being provided on the upper surface of the second layer and extending outwardly from the isolation region by 20 to 100 micrometers,
    wherein a gap of 40 to 100 micrometers is formed between the first metal field plate and the second metal field plate.

12. The diode of claim 2, further comprising:
    a first metal field plate being provided on the upper surface of the second layer and extending outwardly from the doped region; and
    a second metal field plate being provided on the upper surface of the second layer and extending outwardly from the isolation region.

13. The diode of claim 1, wherein the cathode extends from the second edge of the first layer towards the first edge of the first layer.

14. A diode, comprising:
    a substrate of P conductivity type having an upper surface, a lower surface, the substrate having a first edge, and a second edge opposite to the first edge;
    an anode contacting the lower surface of the substrate;
    a layer of N conductivity type being provided on the upper surface of the substrate, the second layer having an upper surface and a lower surface;
    a doped region of N conductivity type being formed in the layer and extending from the first edge of the substrate towards the second edge of the substrate;
    a cathode contacting the doped region and extending from the first edge of the substrate towards the second edge of the substrate;

a passivation layer being provided proximate to the upper surface of the second layer; and an isolation region of P conductivity type formed in the layer extending from the upper surface of the layer to the upper surface of the substrate.

15. The diode of claim 14, wherein the passivation layer is an oxide formed using a PECVD process to reduce a passivation charge effect on the diode.

16. The diode of claim 14, wherein the layer is an epi-layer formed on the substrate, and the anode is longer in width than the cathode.

17. The diode of claim 14, wherein the substrate has resistivity between 0.01 and 0.05 ohm-cm.

18. The diode of claim 14, wherein the cathode extends from the second edge of the substrate towards the first edge of the substrate.

19. A diode, comprising:

a first layer of a first conductivity type having an upper surface, a lower surface, a first edge, and a second edge opposite to the first edge;

a second layer of a second conductivity type being provided over the upper surface of the first layer, the second layer having an upper surface and a lower surface, the lower surface of the second layer facing the upper surface of the first layer;

an anode being provided proximate to the lower surface of the first layer;

a cathode being provided proximate to the upper surface of the second layer and extending from the first edge of the first layer towards the second edge of the first layer;

a doped region of the second conductivity type formed in the second layer, the doped region extending from the first edge of the first layer towards the second edge of the first layer and contacting the cathode; and an isolation region of the first conductivity type formed in the second layer, the isolation region extending vertically from the upper surface of the second layer to the upper surface of the first layer.

* * * * *